United States Patent [19]

Cheney et al.

[11] Patent Number: 5,285,456
[45] Date of Patent: Feb. 8, 1994

[54] SYSTEM AND METHOD FOR IMPROVING THE INTEGRITY OF CONTROL INFORMATION

[75] Inventors: Dennis P. Cheney, Vestal; Richard C. Lang, Endwell; Andrew E. Petruski, Endicott; Mark J. Wolski, Vestal; Robert J. Yagley, Endicott, all of N.Y.

[73] Assignee: International Business Machines Corporation, Armonk, N.Y.

[21] Appl. No.: 700,737

[22] Filed: May 15, 1991

[51] Int. Cl.$^5$ .................. G06F 11/10; H03M 13/00
[52] U.S. Cl. .................................. 371/49.1; 371/51.1
[58] Field of Search ............... 371/49.1, 50.1, 51.1, 371/37.7

[56] References Cited

U.S. PATENT DOCUMENTS

| Re. 33,900 | 4/1992 | Howson | 371/37.7 X |
|---|---|---|---|
| 3,075,175 | 1/1963 | Lourie | 371/50.1 |
| 3,905,023 | 9/1975 | Perpiglia | 340/172.5 |
| 3,988,714 | 10/1976 | Bardotti | 371/49.1 |
| 4,052,698 | 10/1977 | Ragle | 340/146.1 |
| 4,151,510 | 4/1979 | Howell et al. | 340/146.1 |
| 4,211,997 | 7/1980 | Rudnick et al. | 371/38 |
| 4,375,100 | 2/1983 | Tsuji et al. | 371/38 |
| 4,429,390 | 1/1984 | Sonoda et al. | 371/40 |
| 4,433,415 | 2/1984 | Kojima | 371/37 |
| 4,677,612 | 6/1987 | Olson et al. | 370/85 |
| 4,686,621 | 8/1987 | Keeley et al. | 364/200 |
| 4,703,485 | 10/1987 | Patel | 371/37 |
| 4,716,566 | 12/1987 | Masuhara | 371/37.7 |
| 4,785,453 | 11/1988 | Chandran et al. | 371/68 |
| 4,827,478 | 5/1989 | Chan | 371/40.1 |
| 4,833,679 | 5/1989 | Anderson et al. | 371/38 |
| 4,866,666 | 9/1989 | Francisco | 364/900 |
| 4,872,172 | 10/1989 | Sanner | 371/49.1 |
| 4,930,129 | 5/1990 | Takahira | 371/40.4 |
| 5,123,019 | 6/1992 | Boecker | 371/49.1 X |

*Primary Examiner*—Robert W. Beausoliel, Jr.
*Assistant Examiner*—Glenn Snyder
*Attorney, Agent, or Firm*—Sterne, Kessler, Goldstein & Fox

[57] ABSTRACT

A system and method for verifying the integrity of control information and informational data. One embodiment of the present invention verifies the integrity of control information received from a host computer, and verifies the integrity of this information as it is transmitted throughout the present invention. Another embodiment of the present invention contemplates verifying the integrity of informational data sent from a host computer, verifying the integrity of informational data as it is transmitted throughout the present invention, generating a CRC based upon the informational data and control information, and transmitting the informational data, control information and corresponding CRC to a storage device.

23 Claims, 11 Drawing Sheets

SYSTEM AND METHOD FOR IMPROVING THE INTEGRITY OF CONTROL INFORMATION

DESCRIPTION

1. Technical Field

The present invention is a system and method for protecting electronically transmitted control information. More specifically, this invention relates to a system and method for verifying the integrity of control information within a disk controller, and for maintaining the integrity of this information when it is sent to, and received from, a storage device.

2. Background Art

In recent years, there has been an enormous increase in the speed and general capabilities of computers. This has been driven largely by a desire to solve larger and more complex problems. In view of the size of some of these problems and the amounts of raw data that they require, the speed and power of computer peripherals such as mass-storage devices has become very important in order to take full advantage of a powerful computer.

The speed of these storage devices has traditionally lagged significantly behind the speed of state-of-the-art computers. This is largely due to the fact that, unlike the computational portion of a computer (referred to as the "host computer"), storage devices contain moving parts. Consequently, there is a continuing need for faster storage devices which can effectively work in conjunction with today's high speed computers.

A key portion of modern storage devices is a component called the disk controller. The disk controller acts as an interface between the host computer and a storage device. An example of this configuration can be seen from FIG. 1. Referring to FIG. 1, a host computer 102 is shown to be attached to a storage device 106 via a disk controller 104.

It is this disk controller 104 that performs such functions as preparing information sent from the host computer 102 in a format acceptable by the storage device 106, and also provides error detection/correction facilities to ensure that no errors occur while the information is sent to and retrieved from the storage device 106.

Although FIG. 1 shows a disk controller 104 with a single storage device 106, it should be noted that configurations exist where an array of disks can be serviced by a single disk controller. Such a disk controller is commonly referred to as a disk array controller. The usage of disk array controllers is becoming more prevalent due to the high cost of state-of-the-art storage devices Using a disk array controller, data can be striped (that is, divided up) into multiple portions which are sent in parallel to multiple, lower-cost storage devices When data is sent from the host computer 102 to the disk controller 104, it is desirable to use some type of technique to verify that errors did not occur in the data during transmission. One traditional method for detecting errors is by using "parity information." In the configuration envisioned by FIG. 1, parity information, which would be based upon the data, would be created by the host computer 102 prior to sending the data to the disk controller 104.

When the data is received by the disk controller 104, the parity information would be checked. If there is a discrepancy between the data sent by the host computer 102 and what should have been sent according to the parity information, then typically the host computer 102 will re-send the information. The converse operation occurs when the data is sent from the disk controller 104 to the host computer 102. Also, in addition to verifying the integrity of the data travelling between the host 102 and disk controller 104, it is also desirable to verify the integrity of the data while it is transmitted throughout the disk controller 104 itself.

In addition to purely "informational" data, "control information" is also typically sent between the host computer 102 and the disk controller 104. Control information can be defined as information that has the purpose of controlling either the disk controller 104 or the storage device 106 in some way. In other words, it is information that has not been sent by the host computer 102 merely for storage on the storage device 106.

The problem with sending control information to the disk controller is that the use of a parity scheme to verify the integrity of the control information is typically insufficient to protect control information as it is transmitted throughout the disk controller 104. This is because the disk controller 104 can malfunction in such a way that standard parity schemes would not detect an error. For example, if some portion of the disk controller proceeds to erroneously transmit the same portion of control information rather than transmitting sequential portions, then since the correct parity information would be sent with each duplicated portion, no error would be detected.

The above-noted problem can also occur regarding informational data. However, the problem is more acute with regard to control information since control information is typically utilized more extensively within the disk controller 104. Consequently, to verify the integrity of the control information, some other scheme needs to be used in addition to parity alone to verify that the control information is properly protected when it is transferred to and from the host computer 102, and as it is sent through the disk controller 104.

One possible error checking solution would be to use a technique known as cyclic redundancy checking (CRC). In this scheme, CRC information is generated by the host computer 102 or disk controller 104 based upon the information to be sent. The information is then sent and checked in the same way as would be done for the parity scheme discussed above. Again, if there are any errors detected, the host computer 102 or disk controller 104 would be asked to re-transmit the information. In addition, the status of the information can be checked at various points within the disk controller 104 itself to verify that data errors did not occur within the disk controller 104 itself.

The CRC scheme is considered an excellent way to verify the integrity of informational data and control information. However, using this scheme is relatively complex. Also, the generation or evaluation of CRC information is particularly difficult in certain situations, for example, when software is used to generate and/or evaluate a CRC received from and/or sent to highspeed hardware. In this case, the software creates a bottleneck, since the CRC information would have to be generated and/or evaluated very quickly.

An alternative scheme which verifies data integrity better than the use of parity alone, but which is not as difficult to generate as CRC, is a technique known as longitudinal/length redundancy checking (LLRC). The basic idea behind this scheme is the same as for the CRC scheme noted above, except that LLRC information is easier to generate and check than CRC information. Thus, the amount of time and effort needed to use the LLRC scheme is lessened. This allows LLRC to provide a useful compromise where resources are scarce and/or where high-speed transmission is involved. For more information on the use of CRC schemes, see Chapter 13 of Technical Aspects of Telecommunications by John McNamara (Digital Press, Burlington, Mass, USA, 1977). For more information on LLRC schemes, see High-Performance Parallel Interface specification from the American National Standards for Information Systems (Document X3T9, Nov. 1, 1989, revision 7.0) of Washington, D.C. Both of these documents are incorporated by reference herein.

From the above-noted paragraphs, the importance of using LLRC error detection to protect data transmissions between the host computer 102 and the disk controller 104 should be evident. In addition, its importance in maintaining the integrity of the control information as it travels through the disk controller 104 itself should also be apparent. However, even LLRC protection may still be inadequate in certain situations.

An example of where LLRC protection may be suboptimal is where the integrity of control information and/or informational data needs to be verified within the disk controller 104, and where the LLRC information is checked or generated on the disk controller 104 by software. Although this can still be done more efficiently with the LLRC scheme than with the CRC scheme, it may nonetheless still be difficult in some cases for the software portion to keep up with hardware portions of the disk controller 104 which may be sending it information. Consequently, in situations where the host computer 102 is sending information (particularly control information) protected by an LLRC, it may be desirable to convert the LLRC into something more easily checked and manipulated by such a software portion of the disk controller 104.

In addition to maintaining the integrity of control information as it is sent throughout the disk controller 104, it is also vital to maintain the data integrity of the control information when it is sent to, and received by, the storage devices 106. The control information is often sent to the storage device 106 when it has some connection with informational data being stored. For example, control information may be sent with informational data, in which the control information specifies certain attributes relating to the informational data. In such situations, it is often desirable to merge the control information with its corresponding informational data, and protect this composite combination. When this is the case, some way to merge and protect this composite combination also needs to be implemented.

Thus, what is needed is a disk controller 104 which can verify the integrity of LLRC-protected information (particularly control information) as it is sent between a host computer 102 and a disk controller 104, and as it is sent throughout the disk controller, in an efficient manner. In addition, what is needed is a way to protect a combination of control information and related informational data which is transferred to and from a storage device 106.

DISCLOSURE OF INVENTION

Problems which presently exist in the field of technology discussed above have been alleviated by the present invention. Specifically, the present invention provides a system and method for verifying the integrity of control information within a disk controller, and for maintaining the integrity of this information when it is sent to, and received from, a storage device.

Embodiments of the present invention contemplate verifying the integrity of LLRC-protected control information in an efficient manner as the control information is sent between a host computer and a disk controller, and as this information is sent throughout the disk controller itself. This is accomplished by using the LLRC to verify the integrity of the control information received from the host computer and by creating and using an LRC (longitudinal redundancy check) to verify the integrity of the control information as it is transferred throughout the present invention.

Other embodiments of the present invention contemplate verifying the integrity of informational data sent from a host computer, and verifying the integrity of informational data as it is transmitted throughout the present invention. These embodiments also contemplate generating a CRC based upon the informational data and control information and transmitting the informational data, control information and corresponding CRC to a storage device.

Additional embodiments of the present invention contemplate methods for verifying the integrity of control information and combinations of control information and informational data. Further, it should be understood that the embodiments discussed herein can be implemented as both hardware and software embodiments, or a combination thereof.

The foregoing and other objects, features and advantages of the present invention will be apparent from the following more particular description of preferred embodiments of the invention, as illustrated in the accompanying drawings.

BRIEF DESCRIPTION OF DRAWINGS

Various objects, features, and attendant advantages of the present invention can be more fully appreciated as the same become better understood with reference to the following detailed description of the present invention when considered in connection with the accompanying drawings, in which.

BEST MODE FOR CARRYING OUT THE INVENTION

I. Overview

The present invention is a system and method for protecting electronically transmitted control information. More specifically, this invention relates to a system and method for verifying the integrity of control information within a disk controller, and for maintaining the integrity of this information when it is sent to, and received from, a storage device.

Figure 1:
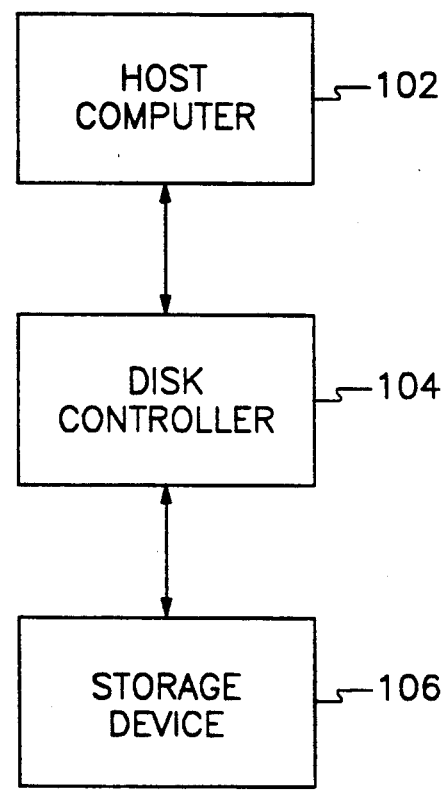
FIG. 1 is a block diagram of an environment in which embodiments of the present invention contemplate to be situated.

In general, the present invention relates to a disk controller 104, as shown in FIG. 1. Embodiments of the present invention contemplate use in an environment where control information is received from and sent to a host computer 102, along with a corresponding LLRC. It is further contemplated that these environments use this control information to control certain aspects of storage device 106. However, the control information can also be used to control various aspects of the disk controller 104 as well.

In addition, the present invention also allows the control information to be combined with informational data, to generate a CRC based upon this composite information, and to send the composite information with its corresponding CRC to a storage device 106. When the composite information is later received from the storage device 106, its integrity is checked using the CRC. The use of the CRC is done only at various portions of the present invention where it is advantageous to do so. More specifically, it is used where it is advantageous to implement hardware capable of performing the task quickly, and where there is an evident need for such considerable error protection.

In addition to verifying the integrity of the control information received from and sent to the host computer 102 and the storage device 106, the present invention also contemplates verifying the integrity of the control information as it is transferred to various components of the present invention. Embodiments of the present invention contemplate that some of this integrity verification is accomplished using software. The above-noted uses and features of the present invention comprise several novel embodiments, which are discussed in detail below.

II. Receipt Of Control Information From The Host Computer 102

Figure 2:
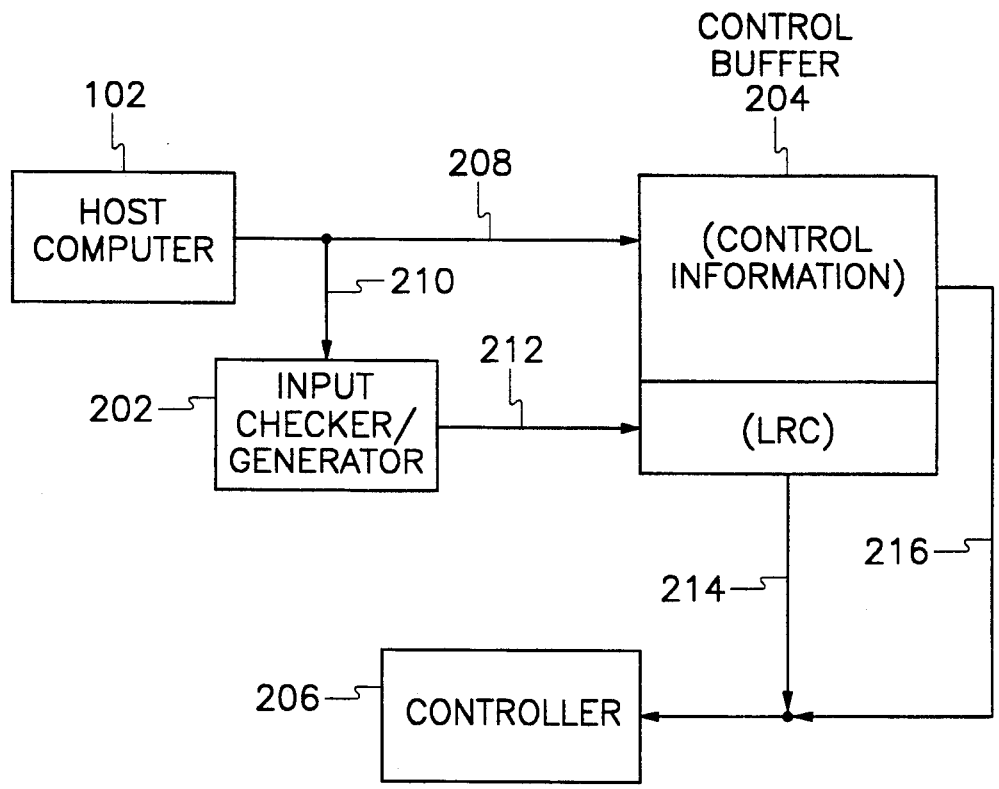
FIG. 2 is a block diagram of embodiments of the present invention which verify the integrity of control information received from a host computer, and verifies the integrity of control information as it, is transmitted throughout the present invention.

Embodiments of the present invention which pertain to receiving and processing control information and its corresponding LLRC, and for verifying the integrity of the control information as it is transferred to various components within the present invention can best be shown with regard to FIG. 2.

Referring now to FIG. 2, a control buffer 204 and an input checker/generator 202 concurrently receive the control information sent from the host computer 102 via lines 208 and 210. The input checker/generator 202 subsequently receives the LLRC corresponding to the control information via a line 210.

As contemplated by embodiments of the present invention, one of the functions of the input checker/generator 202 is to generate an LRC (Longitudinal Redundancy Checking information) based upon the control information received from the host computer 102. Note that an LRC does not have the "length" information that an LLRC has. An LRC rather than an LLRC is used in embodiments of the present invention where it is advantageous to use a mechanism which is slower than the mechanism from which the control information is being received from. Embodiments of the present invention contemplate that such a slower mechanism primarily involves the use of software. If the LLRC were used in a situation where hardware was transferring the control information and corresponding LLRC, then it would be more difficult for the software to keep up with the faster hardware. This will be discussed further below.

Once the LRC is generated, the input checker/generator 202 is then used to generate an LLRC based upon the control information received from the host computer 102. The input checker/generator 202 then compares this generated LLRC to the LLRC received from the host computer 102. This is to ensure that the integrity of the control information did not deteriorate as it was transferred from the host computer 102 to the present invention. If the two LLRCs are not identical, this indicates that the integrity of the control information is bad, and embodiments of the present invention contemplate that an error signal is generated.

Embodiments of the present invention contemplate that the LRC which was generated as discussed above is sent to the control buffer 204 via line 212, concurrently with the generation and comparison of the LLRCs The control buffer 204 is shown as divided into two segments, one for the control information and the other for the LRC. This distinction is to show that the control buffer 204 is contemplated to set aside an area for the control information, and another area for the LRC.

Once the control information and LRC have been transferred to the control buffer 204, then the control information is sent to a controller 206 via line 216, and the LRC is sent to the controller 206 via line 214. In order to check the integrity of the control information after it has been sent to the controller 206, the controller 206 generates an LRC based upon the control information received from the control buffer 204, and checks that LRC with the LRC received from the control buffer 204. Embodiments of the present invention contemplate that this is accomplished using software.

While the description of the above-noted embodiments have indicated that certain "lines" of communication between components are contemplated, it should be understood that other "line" configurations could also be used.

Figure 3A:
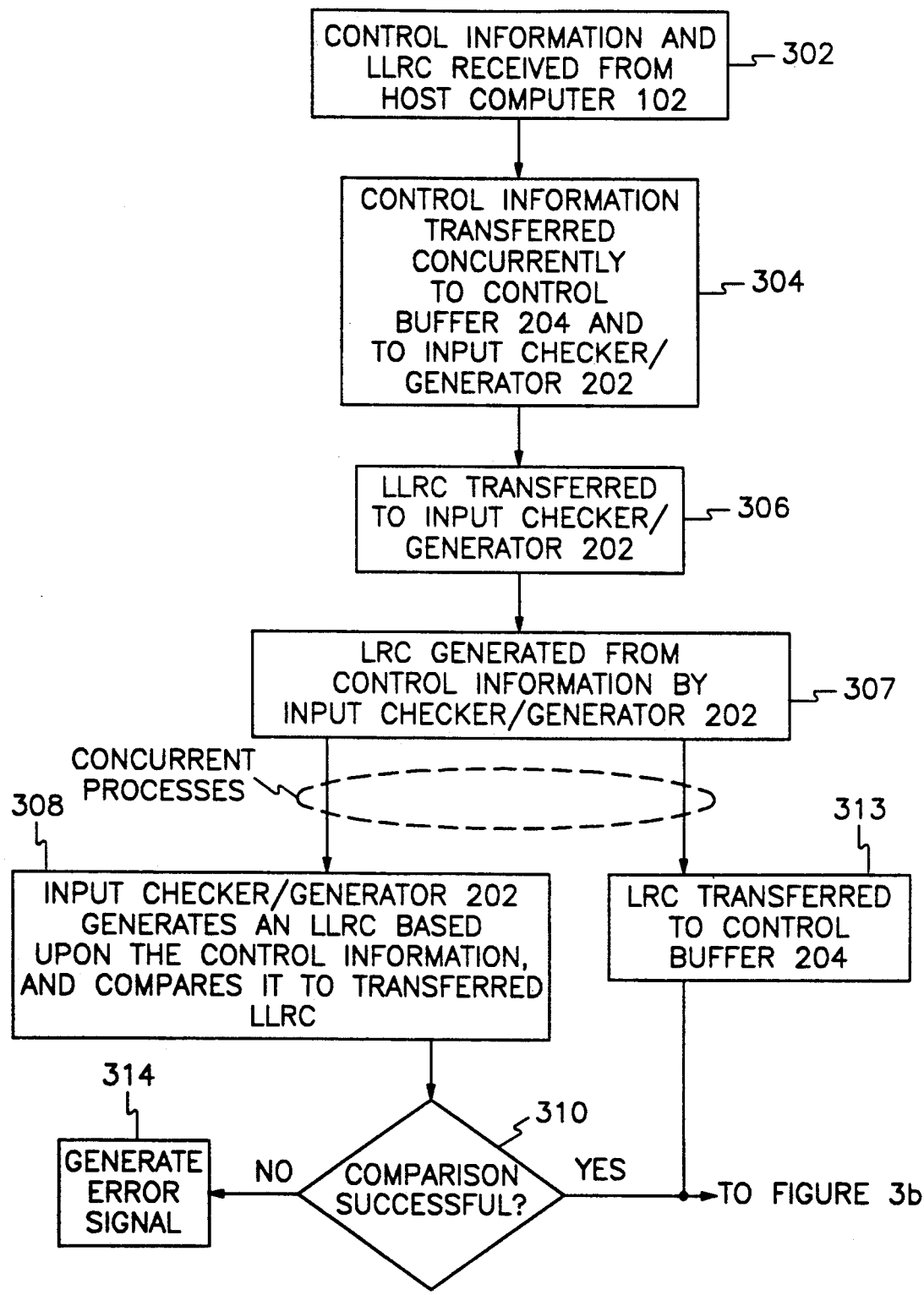
FIGS. 3a and 3b are flow diagrams of a method contemplated by embodiments of the present invention which verify the integrity of control information received from a host computer, and which verify the integrity of the control information as it is transmitted throughout the present invention.
Figure 3B:
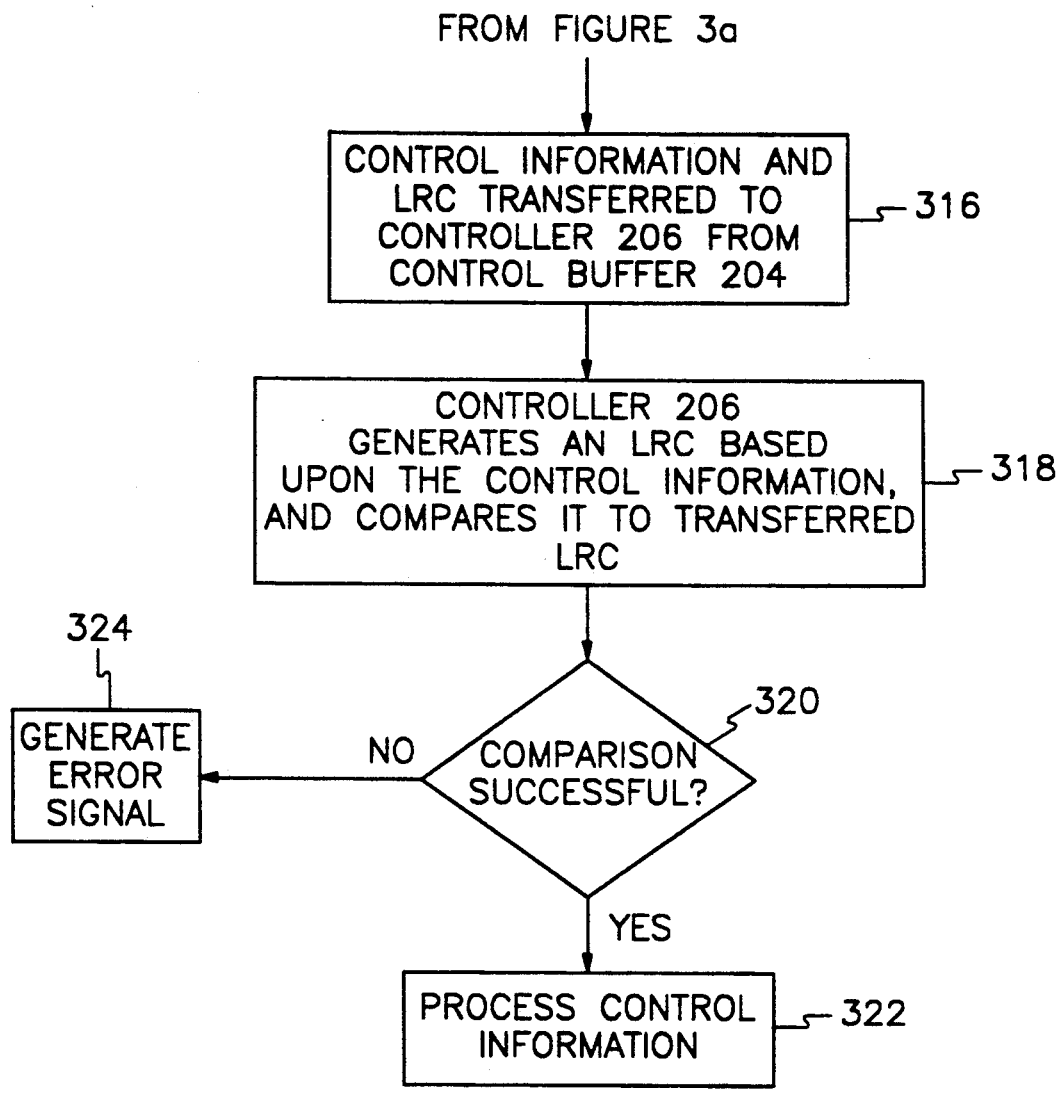

Embodiments of a method of operation of the present invention are described using the flow diagrams of FIGS. 3a and 3b. Referring to these FIGURES, control information and corresponding LLRC are received from the host computer 102, as indicated by a block 302. This control information is transferred concurrently to the control buffer 204 and to the input checker/generator 202, as indicated by a block 304. The LLRC from the host computer 102 is then transferred to the input checker/generator 202, as indicated by a block 306.

The input checker/generator 202 then generates an LRC based upon the control information sent from the host computer 102. This is shown by a block 307. Two concurrent processes then occur The first of these concurrent processes is that the input checker/generator 202 generates its own LLRC based upon the control information. This generated LLRC is then compared to the LLRC transferred from the host computer 102, as indicated by a block 308.

If the comparison between the above-noted LLRCs is not successful, then embodiments of the present invention contemplate that an error signal will be generated, as indicated by a decision block 310 and a block 314. Embodiments of the present invention contemplate that one result of this error signal is that the host computer 102 is signalled to re-transfer the control information previously sent. Of course, the present invention also contemplates that other possible results can occur as well, such as the termination of the entire process.

The second concurrent process is that the LRC generated as per block 307 is transferred to the control buffer 204, as indicated by a block 313.

The control information and LRC are then transferred to a controller 206 from control buffer 204, as indicated by a block 316. In order to verify the integrity of this control information after this transfer has occurred, the controller 206 generates its own LRC based upon the control information just sent from the control buffer 204, and compares this newly generated LRC to that which was just transferred by the control buffer 204. This is indicated by a block 318. If this comparison is not successful, then an error signal will be generated, as indicated by a decision block 320 and a block 324.

If, however, the comparison indicated by decision block 320 is successful, then the control information will be processed, as indicated by a block 322. This processing of the control information, which is contemplated to be accomplished by the environment used with the present invention, can have any number of functions, including the facilitation of storing certain types of information in a certain way on one or more storage devices.

III. Transfer Of Control Information To The Host Computer

Embodiments of the present invention also contemplate protecting the control information as it passes through the present invention from the controller 206 to the host computer 102. These embodiments will be discussed with regard to FIG. 4. It should be noted that some of these embodiments contemplated by the present invention envision that separate components be used from those described in FIG. 2, even though the components may have identical functionality. For this reason, these identical components have different reference numbers in FIG. 4 than are shown in FIG. 2. However, it should be understood that other embodiments of the present invention contemplate that the exact same components be used when the control information is coming from the host computer 102 and when it is being sent to the host computer 102.

Figure 4:
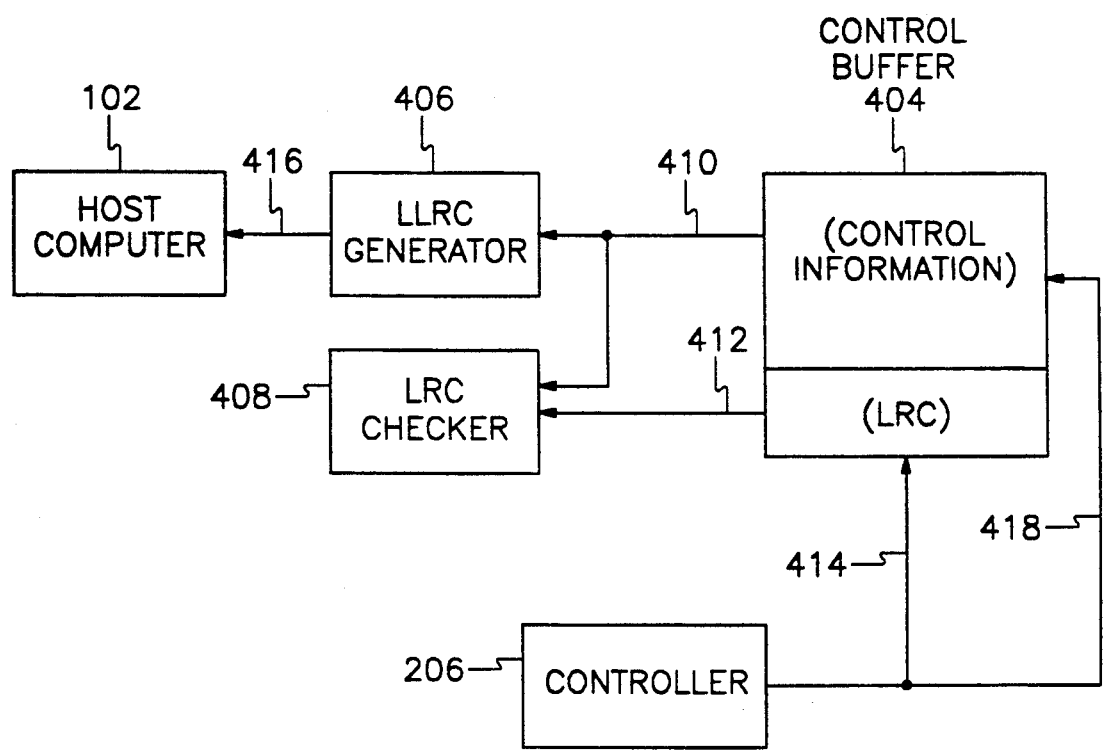
FIG. 4 is a block diagram of embodiments of the present invention for verifying the integrity of control information as it is transmitted through the present invention prior to being transmitted to a host computer.

Referring now to FIG. 4, the controller 206 already contains control information (which embodiments of the present invention contemplate could have been derived from the control information received as per the embodiment of FIG. 2). From this control information, the controller 206 generates an LRC. The control information is then sent to a control buffer 404 via a line 418, and the generated LRC is sent to the control buffer 404 via a line 414 The control information in the control buffer 404 is then sent to an LLRC generator 406, and an LRC checker 408 via a line 410.

At the LRC checker 408 the control information is used to generate an LRC. The LRC in control buffer 404 is then sent to the LRC checker 408 via a line 412, and compared to the LRC previously generated. This is done to verify the integrity of the control information when it is transferred from the controller 206 to the control buffer 404.

At the same time that the LRC is being checked by the LRC checker 408, the control information is sent to the host computer 102 via a line 416, and the LLRC generator 406 generates an LLRC based upon the control information sent from the control buffer 404. This LLRC is then also sent to the host computer 102 via line 416.

Embodiments of the present invention contemplate that the LLRC generator 406 first generates an LRC based upon the control information, and then uses a counter to determine the length information needed to create an LLRC from the LRC. Since both the LLRC generator 406 and the LRC checker 408 require a mechanism for creating an LRC, some of these embodiments contemplate that a single LRC generating mechanism is used for both the LLRC generator 406 and the LRC checker 408.

Figure 5:
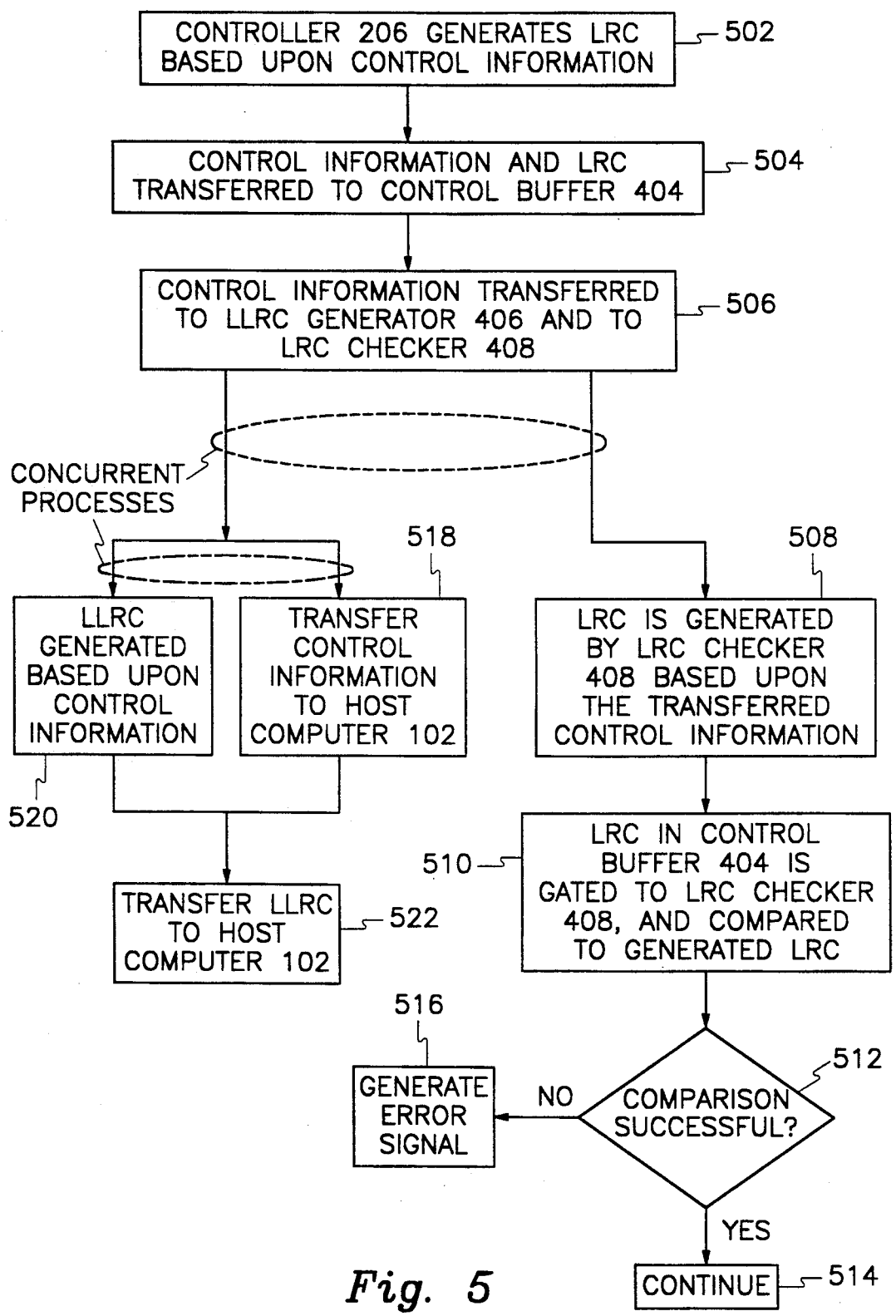
FIG. 5 is a flow diagram of a method contemplated by embodiments of the present invention for verifying the integrity of control information as it is transmitted through the present invention prior to being transmitted to a host computer.

Embodiments of a method of operation of the present invention are described using the flow diagram of FIG. 5. Referring now to FIG. 5, the controller 206 generates an LRC based upon control information. This is shown by a block 502. This control information and LRC are then transferred to the control buffer 404, and indicated by a block 504. The control information is then transferred from the control buffer 404 to the LLRC generator 406 and to the LRC checker 408, as indicated by a block 506.

Embodiments of the present invention then contemplate that three processes occur concurrently. The first is that the control information is transferred to the host computer 102 as indicated by a block 518. The second is that the LLRC generator 406 generates an LLRC based upon the control information which it has received, as indicated by a block 520. This LLRC is then transferred to the host computer 102 following the transfer of the control information, as indicated by a block 522.

The third concurrently occurring process involves an LRC being generated by LRC checker 408 based upon the control information received by the LRC checker 408. This is indicated by a block 508. The LRC in the control buffer 404 is then gated to the LRC checker 408 and compared to the newly generated LRC. This is shown by a block 510. If the comparison of these LRCs is not successful, then an error signal will be generated, as indicated by a decision block 512 and a block 516. However, if the comparison is successful, then the process will "continue" (in some fashion decided upon by the environment of the present invention) as indicated by a block 514.

Figure 6:
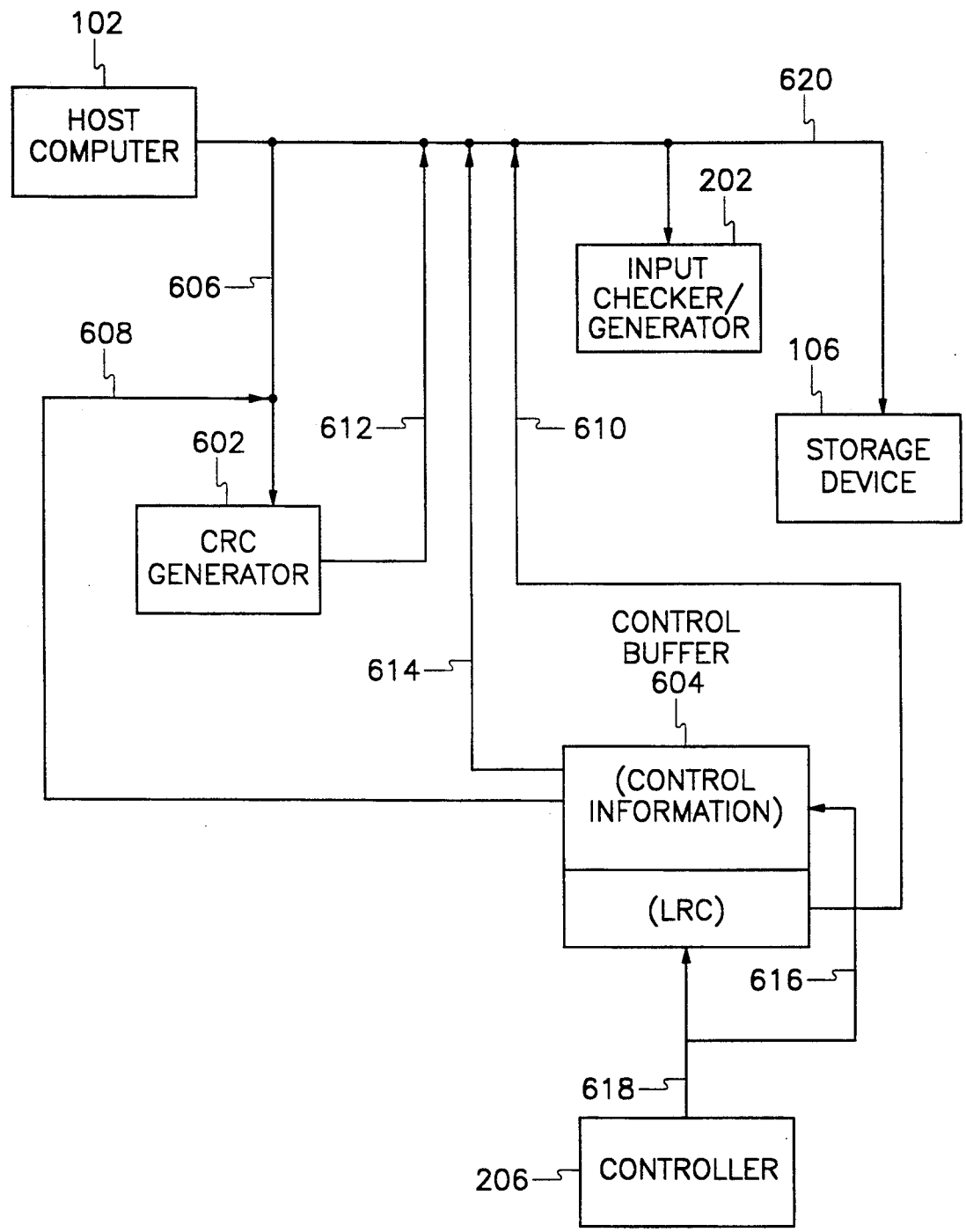
FIG. 6 is a block diagram of embodiments of the present invention for verifying the integrity of informational data received from a host computer, for verifying the integrity of control information as it is transmitted throughout the present invention, and for creating CRC protection for a combination of informational data and control information.

IV. Protection And Storage Of Informational Data And Control Data On Storage Device Embodiments of the present invention which contemplate verifying the integrity of control information and informational data while passing between the host computer 102 and the storage device 106 is explained below regarding FIG. 6. Referring now to FIG. 6, the controller 206 generates an LRC based upon control information within the controller 206, and transfers this control information to the control buffer 604 via lines 618 and 616. The LRC information is also transferred to the control buffer 604 via line 618. Embodiments of the present invention contemplate that this is done to prepare the control information for being combined with informational data from the host computer 102, and transferred to the storage device 106.

Informational data from the host computer 102 is then received concurrently by a CRC generator 602 via line 606, the input checker/generator 202 via line 620 and the storage device 106 via line 620. A corresponding LLRC from the host computer 102 is also concurrently received by the CRC generator 602 via line 606 and input checker/generator 202 via line 620. The input checker/generator 202 verifies the integrity of the informational data by generating an LLRC and comparing it to that which was sent via the host computer 102, as discussed above with regard to FIG. 2.

The CRC generator 602 generates an "intermediate" CRC based upon the informational data. The control information in the control buffer 604 is subsequently used with this intermediate CRC to generate a final CRC based upon a combination of the informational data and the control information. The control information and final CRC corresponding to the combination of the informational data and control information are then sent to the storage device 106 via lines 614 and 612 respectively, and then via line 620.

Embodiments of the present invention envision that while this final CRC is being generated, the control information from control buffer 604 is sent to the input checker/generator 202 via line 614, which generates an LRC based upon the control information. This LRC is then checked with the LRC in control buffer 604, which is received by the input checker/generator 202 via line 610.

Figure 7A:
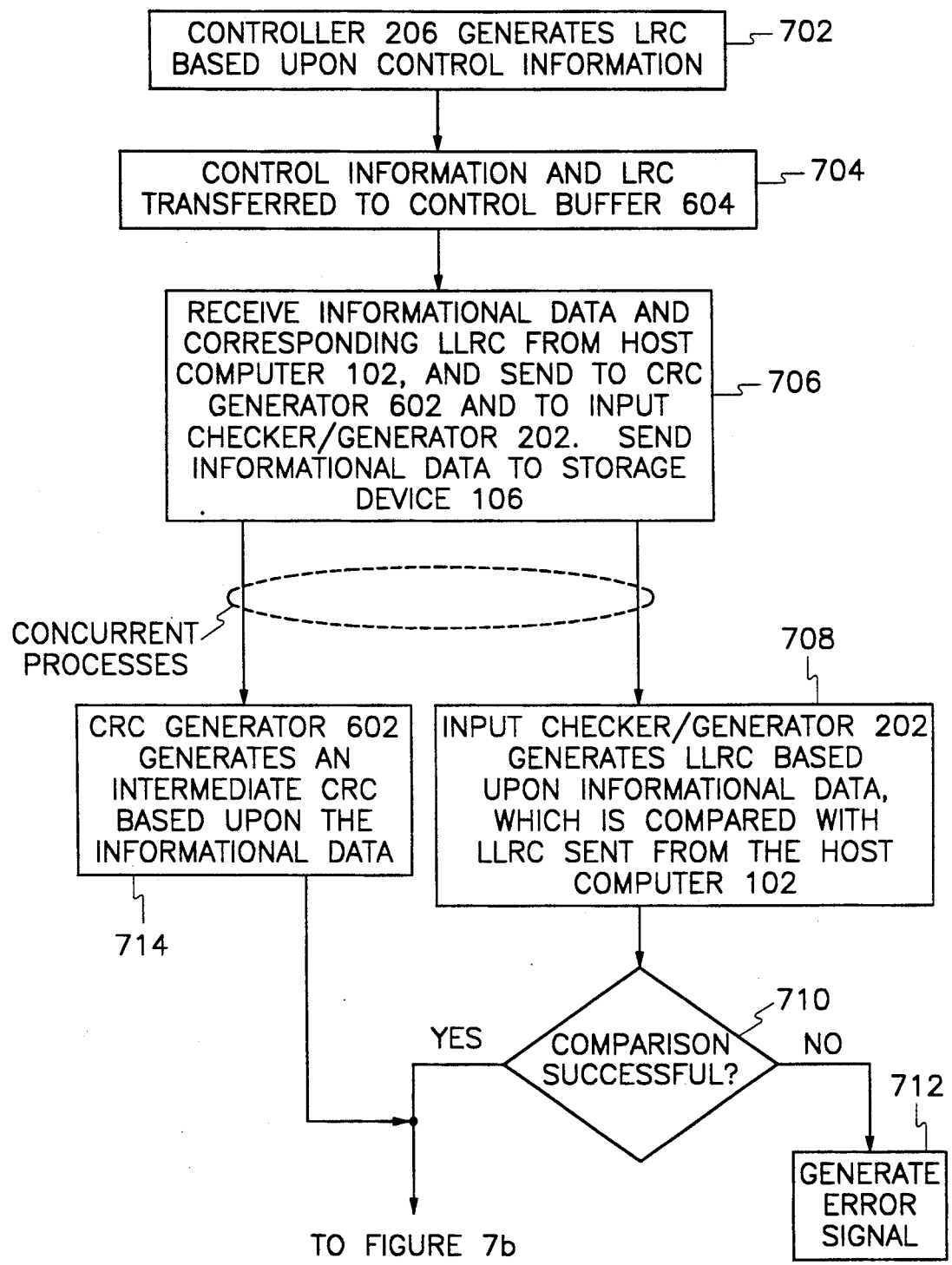
FIGS. 7A and 7B are flow diagrams of a method contemplated by embodiments of the present invention for verifying the integrity of informational data received from a host computer, for verifying the integrity of control information as it is transmitted throughout the present invention, and for creating CRC protection for a combination of informational data and control information.
Figure 7B:
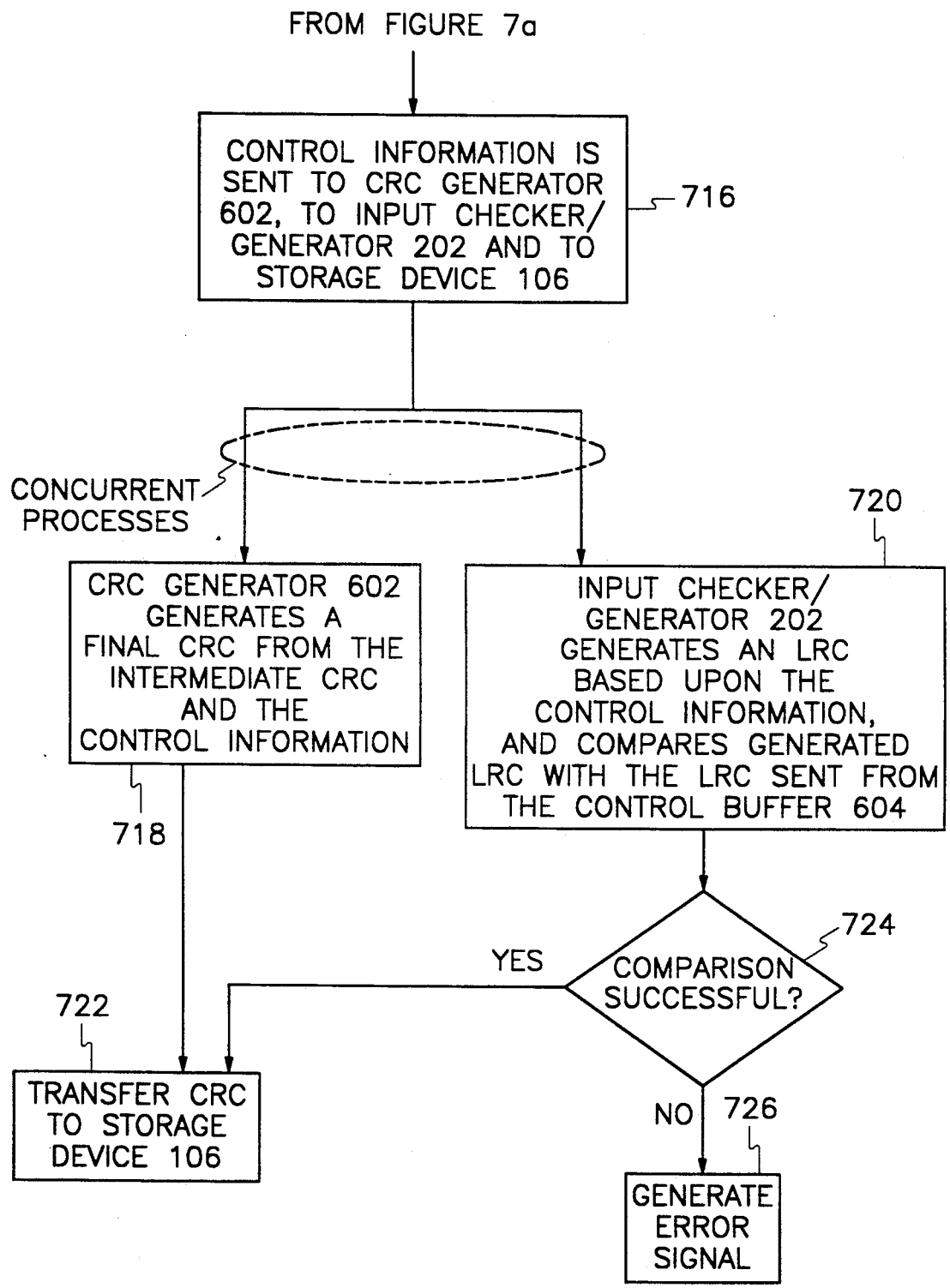

Embodiments of a method of operation of the present invention are described using the flow diagrams of FIGS. 7a and 7b. Referring to these FIGURES, the controller 206 generates an LRC based upon control information, as indicated by a block 702. This control information and generated LRC are transferred to the control buffer 604 as indicated by a block 704.

The present invention then receives informational data and a corresponding LLRC from the host computer 102 and sends the informational data and corresponding LLRC to the CRC generator 602 and the input checker/generator 202. The informational data by itself is also sent to a storage device 106. This is indicated by a block 706.

In embodiments contemplated by the present invention, two concurrent processes subsequently occur. In one, the CRC generator 602 generates an intermediate CRC based upon the informational data which is sent to it. This is indicated by a block 714. Thus, in embodiments contemplated by the present invention, the LLRC is ignored by the CRC generator 602.

The second concurrent process is that the input checker/generator 202 generates an LLRC based upon the informational data received from the host computer 106, as indicated by a block 708. This newly generated LLRC is then compared with the LLRC sent from the host computer 102. If the comparison is not successful, an error signal will be generated, as indicated by a decision block 710 and a block 712. In embodiments of the present invention, this could cause the entire process to stop. It can also cause the host computer 106 to re-send the informational data.

If the comparison is successful, then the control information in control buffer 604 is sent to the CRC generator 602, the input checker/generator 202 and the storage device 106. This is indicated by a block 716.

Embodiments of the present invention then contemplate that two concurrent processes occur. The first is that the CRC generator 602 generates a final CRC from the intermediate CRC and the control information. This is indicated by a block 718. The second concurrent process is that the input checker/generator 202 generates an LRC based upon the control information sent to it, and compares this generated LRC with the LRC from the control buffer 604. This is indicated by a block 720. If the comparison is not successful, then an error signal will be generated, as indicated by a decision block 724 and a block 726.

If the above-noted comparison is successful, however, then the CRC will be transferred to the storage device 106 as indicated by a block 722.

It should be understood that embodiments of the present invention also contemplate the situation where the informational data and control information are received from the storage device 106. In that case, a component for checking the CRC would be required. In addition, an LLRC would need to be generated based upon the informational data, and sent with the informational data back to the host computer 102.

Figure 8:
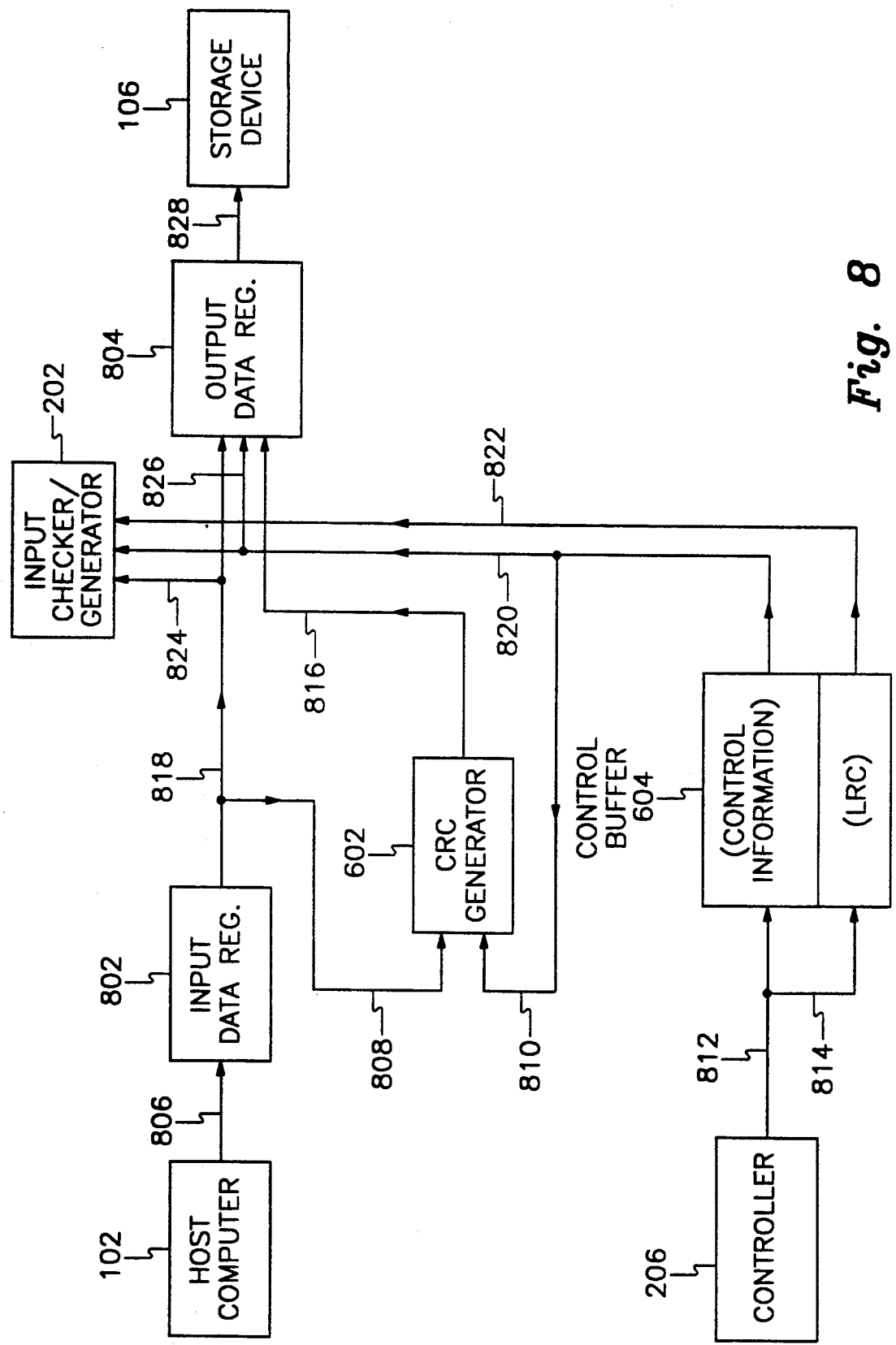
FIG. 8 is a block diagram of embodiments of the present invention for verifying the integrity of informational data received from a host computer, for verifying the integrity of control information as it is transmitted throughout the present invention, and for creating CRC protection for a combination of informational data and control information, in which data registers are used to control the flow of information between a host computer and a storage device.

An embodiment contemplated by the present invention which is similar to that shown in FIG. 6 is shown in FIG. 8. However, the embodiment shown in FIG. 8 also includes an input data register (input data reg) 802 and an output data register (output data reg) 804. These registers help control the flow of information between the host computer 102 and the storage device 106. It should be understood that in embodiments of the present invention where the informational data and control information is received from the storage device 106, such registers are also contemplated for use. It should also be understood that buffers such as RAM buffers could be used in place of these registers.

V. Timing Diagram Of Embodiment Of FIG. 8

Figure 9:
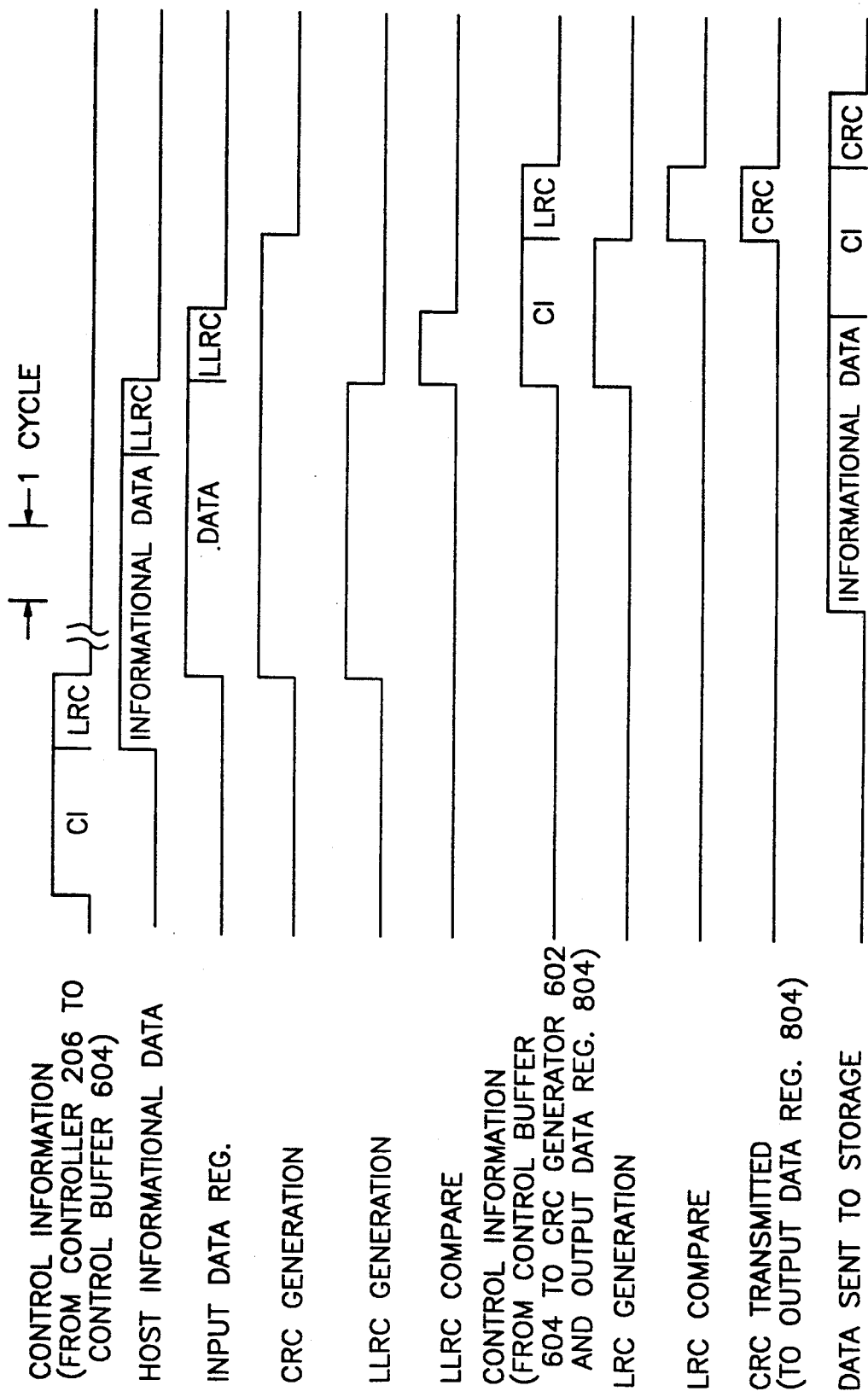
FIG. 9 is a timing diagram of the sequence of events that occur as contemplated by the embodiments of the present invention contemplated by FIG. 8.

An event/sequence timing diagram regarding the embodiment shown by FIG. 8 is shown at FIG. 9. Referring now to FIGS. 8 and 9, the first timing line shows that the control information (denoted by CI) and its corresponding LRC are transferred from controller 206 to the control buffer 604. In embodiments contemplated by the present invention, the transfer of the control information requires two cycles, and the LRC requires one cycle. Thus, the timing line is "active" (i.e., high) for a total of 3 cycles. The representation (i.e. length) for one cycle is shown at the top of FIG. 9.

The break in the timing line that is shown for the transfer of the control information represents the fact that the remaining activities take place at some arbitrary time after the control information and LRC are sent. It should be understood that while embodiments of the present invention contemplate the transfer of the control information and LRC to take a total of three cycles, that any number of cycles could also have been used for this transfer.

The next timing line represents the transfer of the informational data from the host computer 102 to the present invention. This informational data is also shown to be accompanied by its corresponding LLRC. In embodiments shown by FIG. 9, the transfer of the informational data occurs in four cycles, and the corresponding LLRC occurs in one. However, any number of cycles could have been used for the transfer of either the informational data or the LLRC.

The Input Data Register timing line is the same as that for the informational data above, except that it is offset by one cycle. Embodiments of the present invention contemplate that this is due to clock timing. However, other embodiments contemplate that these two timing lines are identical.

Embodiments of the present invention contemplate that the input data register 802 sends any received data or information to other components on the same clock cycle. This is why the CRC generation and LLRC timing lines are active at the same time as the Input Data Register timing line. Referring first to the CRC Generation timing line, the length that this line is active is due to the generation of a CRC based upon the informational data, plus the creation of the CRC based upon the control information. This extra length for the control information can be seen from the Control Information timing line representing data being transferred from the control buffer 604 to the CRC generator 602, as indicated below.

The LLRC Generation timing line is active only for the time that the informational data itself is sent to it. This is because an LLRC is generated only based upon the informational data. Immediately after the LLRC has been generated, it is compared to the LLRC sent from the host computer 102, and thus the LLRC Compare timing line becomes active.

The next timing line represents the transfer of control information from the control buffer 604 to the CRC generator 602, and also the transfer of control information from the control buffer 604 to the output data register 804. In addition, the LRC is transferred from the control buffer 604 to the input checker/generator 202 after the control information is transferred. Embodiments of the present invention contemplate that the transfer of the control information requires two cycles, while the transfer of the LRC requires one.

The next timing line indicates the LRC Generation which occurs at the input checker/generator 202. It can be seen this is contemplated to occur in parallel with the transfer of the control information noted above. Thus, the new LRC is being generated as the control information is being sent to the input checker/generator 202.

Once all of the control information has been received by the input checker/generator 202 and thus an entire LRC has been generated, the generated LRC is compared to that which was sent from the control buffer 604. This comparison is shown by the LRC Compare timing line.

Embodiments of the present invention contemplate that the CRC is transmitted to the output data register 804 at the same time that the LRCs are being compared as discussed above. This is shown by the CRC Transmitted timing line.

The last timing line in FIG. 9 represents when certain data and information are sent to the storage device 106 from the output data register 804. Thus, it can be seen from this timing line that the informational data is sent first, followed by the control information and then the CRC. It should be noted that in embodiments of the present invention, the informational data being sent to the storage device 106 has a one cycle lag time from receipt of the informational data by the input data register 802.

VI. Specific Implementations of the Present Invention

Embodiments of the present invention contemplate that the controller 206 discussed above uses a Motorola 68020 microprocessor in conjunction with static random access memory. However, other types of processors could also be used. In addition, the logic for verifying the integrity of control information and informational data is controlled by ASIC VLSI technology. It is also contemplated that the CRC generation is done in accordance with the CRC-CCITT protocol, discussed at p.154 of McNamara.

Embodiments of the present invention also contemplate that the LRC and LLRC protection is accomplished in conjunction with the use of parity information.

It should be understood that the present invention can be implemented in software embodiments. In such embodiments, the various components and steps would be implemented in software to perform the functions of the present invention. Any presently available or future developed computer software language can be employed in such software embodiments of the present invention.

While the invention has been particularly shown and described with reference to preferred embodiments thereof, it will be understood by those skilled in the art that various changes in form and details may be made therein without departing from the spirit and scope of the invention.

Having thus described our invention, what we claim as new and desire to secure by Letters Patent is:

1. A system for maintaining the integrity of control and informational data passed between a host computer, controller, and a storage device, comprising:

input checker/generator means for determining the integrity of informational data generated by the host computer based on a first error detection code generated by the host computer, and also for determining the integrity of a second control information generated by the controller based on a second error detection code generated by the controller;

wherein said first error detection code is generated by the host computer based upon informational data and wherein said second error detection code is generated by the controller based upon said second control information;

error detection code generator means for generating a third error detection code based on said informational data received from the host computer and said second control information received from the controller;

first control buffer means for buffering said second control information and said second error detection code generated by the controller; and storage transfer means for transferring the informational data, said second control information, and said third error detection code to the storage device.

2. The controller of claim 1, wherein said second control information within said controller means is a modified version of a first control information received from the host computer and wherein said controller means performs said modification of said first control information to achieve said second control information.

3. The system of claim 2, wherein said input checker/generator means generates a fourth error detection code based on said informational data received from the host computer and compares said fourth error detection code with said first error detection code received from the host computer to determine said integrity of said informational data, wherein said fourth error detection code with said first error detection code received from the host computer to determine said integrity of said informational data, wherein said fourth error detection code and the first error detection code are the same type of error detection code.

4. The system of claim 3, wherein said input checker/generator means generates a fifth error detection code based on said second control information generated by said controller means and compares said fifth error detection code with said second error detection code generated by said controller means to determine said integrity of said second control information, wherein said fifth error detection code and said second error detection code are the same type of error detection code.

5. The system of claim 4, wherein said host computer generates and transmits a sixth error detection code based on said first control information;

said input checker/generator means generates a seventh error detection code based on said first control information and compares said seventh error detection code with said sixth error detection code to determine the integrity of said first control information received from the host computer, wherein said sixth error detection code and said seventh error detection code are the same type of error detection code; and said input checker/generator means generates an eighth error detection code for use by said controller means to determine the integrity of said first control information.

6. The system of claim 5, wherein said seventh error detection code and said eighth error detection code are the same type of error detection code.

7. The system of claim 5, further comprising:

second control buffer means for buffering said eighth error detection code received from said input checker/generator means and said first control information received from the host computer and simultaneously transmitting said first control information and said eighth error detection code to said controller means.

8. The system of claim 7, wherein said controller means determines the integrity of said first control information received from said second control buffer means, said controller means generating a ninth error detection code based on said first control information and comparing said ninth error detection code with said eighth error detection code, wherein said ninth error detection code and said eighth error detection code are the same type of error detection code.

9. The system of claim 8, further comprising:

third control buffer means for buffering said second error detection code and said second control information generated by said controller and simultaneously transmitting said second control information and said second error detection code to the host computer.

10. The system of claim 9, wherein said first error detection code and said fourth error detection code are LLRC error detection codes.

11. The system of claim 9, wherein said second error detection code and said fifth error detection code are LRC error detection codes.

12. The system of claim 9, wherein said error detection code generator means generates an intermediate error detection code based only on said first information data, said intermediate error detection code and said third error detection code being the same type of error detection code, said error detection code generator means generating said third error detection code based on a composite of said intermediate error correction code and said second control information, and wherein said third error detection code and said intermediate error detection code are CRC error detection codes.

13. The system of claim 9, wherein said input checker/generator generates an error signal when the integrity of said first control information and/or said second control information is bad.

14. The system of claim 13, wherein said first control buffer means and said second control buffer means have a control block segment and an error detection code segment, for buffering the control information in said control block segment and for buffering the error detection codes in said error detection code segment.

15. A system for maintaining the integrity of control and informational data, comprising:

a host computer configured to generate and transmit informational data and a first error detection code based on the informational data, said host computer also configured to generate and transmit a first control information;

a storage device for storing said informational data;

controller means for generating a second error detection code based upon a second control information within said controller means;

input checker/generator means for determining the integrity of said information data generated by said host computer and also for determining the integrity of said second control information generated by said controller means;

error detection code generator means for generating a third error detection code based on said informational data received from said host computer and said second control information received from said controller means; and storage transfer means for transferring said informational data, said second control information, and said third error detection code to said storage device;

wherein said second control information within said controller means is a modified version of the first control information received from said host computer and wherein said controller means performs said modification of the first control information to achieve said second control information.

16. The system of claim 15, further comprising:
an input data register for temporarily storing said informational data and said first control information generated by said host computer; and
an output data register for temporarily storing said informational data, said second control information, and said third error detection code transmitted to said storage device.

17. The system of claim 16, wherein said storage device is configured to generate and transmit said information data and a third control information and wherein said output data register is further configured to temporarily store said informational data and said third control information transmitted from said storage device.

18. A method for maintaining the integrity of informational data passed between a host computer and a storage device, wherein the host computer generates and transmits a first control information and a first error detection code based upon the informational data, comprising the steps of:
(1) generating a second error detection code based upon a second control information within a controller;
(2) transferring said second control information and said second error detection code from said controller to a first control buffer;
(3) transferring the informational data received from the host computer to an error detection code generator and to an input checker/generator;
(4) determining the integrity of the informational data received from the host computer, using said input checker/generator;
(5) transferring said second control information from said first control buffer to said error detection code generator and to said input checker/generator;
(6) determining the integrity of said second control information, using said input checker/generator;
(7) generating a third error detection code based upon the informational data received from the host computer and said second control information generated by said controller; and
(8) transferring the informational data, said second control information and said third error detection code to the storage device.

19. The method of claim 18, further comprising the steps of:
(9) transferring the first control information to a second control buffer;
(10) generating and transferring a sixth error detection code based on the first control information to said input checker/generator, using the host computer;
(11) verifying the integrity of the first control information received from the host computer, using said input checker/generator;
(12) transferring an eighth error detection code to said second control buffer;
(13) concurrently transferring the first control information and said eighth error detection code from said second control buffer to said controller;
(14) verifying the integrity of the first control information received from the host computer, using said controller; and
(15) modifying the first control information received from the host computer to achieve said second control information, using said controller.

20. The method of claim 18, wherein step (4) comprises the further steps of:
(a) creating and generating a fourth error detection code by the input checker/generator based on the informational data received from the host computer; and
(b) comparing said fourth error detection code to the first error detection code transmitted form the host computer to verify the integrity of the informational data received from the host computer.

21. The method of claim 18, wherein step (6) comprises the further steps of:
(a) creating and generating a fifth error detection code by the input checker/generator based on said second control information received from said first control buffer; and
(b) comparing said fifth error detection code to said second error detection code transmitted from said first control buffer to verify the integrity of said second control information received from said controller.

22. The method of claim 19, wherein step (11) comprises the further steps of:
(a) creating and generating a seventh error detection code by the input checker/generator based on the first control information received from the host computer; and
(b) comparing said seventh error detection code to the sixth error detection code transmitted from the host computer to verifying the integrity of the first control information received from the host computer.

23. The method of claim 19, wherein step (14) comprises the further steps of:
(a) creating and generating a ninth error detection code by said controller based on the first control information received from said second control buffer; and
(b) comparing said ninth error detection code to said eighth error detection code transmitted from said second control buffer to verify the integrity of the first control information received from said second control buffer.

* * * * *